United States Patent
Juluri et al.

(10) Patent No.: US 7,962,833 B2
(45) Date of Patent: Jun. 14, 2011

(54) UNIFIED MEMORY ARCHITECTURE FOR RECORDING APPLICATIONS

(75) Inventors: Rajesh Juluri, San Jose, CA (US); Cheng Qian, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/577,382

(22) Filed: Oct. 12, 2009

(65) Prior Publication Data

US 2010/0031123 A1 Feb. 4, 2010

Related U.S. Application Data

(62) Division of application No. 11/299,506, filed on Dec. 12, 2005, now Pat. No. 7,624,330.

(51) Int. Cl.
*H03M 13/00* (2006.01)
(52) U.S. Cl. ......... 714/769; 714/785; 714/755; 714/756
(58) Field of Classification Search .................. 714/769, 714/785, 755, 756
See application file for complete search history.

(56) References Cited

U.S. PATENT DOCUMENTS

| | | | | |
|---|---|---|---|---|
| 4,849,975 A | * | 7/1989 | Patel | 714/761 |
| 5,398,073 A | * | 3/1995 | Wei | 348/487 |
| 5,446,743 A | * | 8/1995 | Zook | 714/784 |
| 5,721,739 A | * | 2/1998 | Lyle | 714/755 |
| 5,844,920 A | * | 12/1998 | Zook et al. | 714/769 |
| 5,920,578 A | * | 7/1999 | Zook | 714/755 |
| 5,923,682 A | * | 7/1999 | Seyyedy | 714/773 |
| 5,974,580 A | * | 10/1999 | Zook et al. | 714/755 |
| 5,991,911 A | * | 11/1999 | Zook | 714/758 |
| 5,996,105 A | * | 11/1999 | Zook | 714/755 |
| 6,047,395 A | * | 4/2000 | Zook | 714/756 |
| 6,048,090 A | * | 4/2000 | Zook | 714/755 |
| 6,052,815 A | * | 4/2000 | Zook | 714/758 |
| 6,061,655 A | * | 5/2000 | Xue et al. | 704/500 |
| 6,115,837 A | * | 9/2000 | Nguyen et al. | 714/769 |
| 6,177,892 B1 | * | 1/2001 | Ko | 341/106 |
| 6,272,659 B1 | * | 8/2001 | Zook | 714/774 |
| 6,278,838 B1 | * | 8/2001 | Mendenhall et al. | 386/125 |
| 6,295,267 B1 | * | 9/2001 | Takaku et al. | 369/83 |
| 6,363,511 B1 | * | 3/2002 | Massoudi | 714/755 |
| 6,553,533 B2 | * | 4/2003 | Demura et al. | 714/769 |
| 6,577,566 B1 | * | 6/2003 | Tomita | 369/44.26 |
| 6,662,336 B1 | * | 12/2003 | Zook | 714/786 |
| 6,832,042 B1 | * | 12/2004 | Shieh | 386/125 |
| 7,134,069 B1 | * | 11/2006 | Longwell et al. | 714/800 |
| 2006/0179400 A1 | * | 8/2006 | Qian et al. | 714/784 |
| 2007/0136641 A1 | * | 6/2007 | Juluri et al. | 714/769 |

* cited by examiner

*Primary Examiner* — Joseph D Torres
(74) *Attorney, Agent, or Firm* — Christopher P. Maiorana, PC

(57) ABSTRACT

An apparatus comprising a first circuit, a second circuit and a disc. The first circuit may be configured to (i) extract video data as data blocks from an input signal and (ii) perform error correction on the data blocks with a delta syndrome based iterative Reed-Solomon decoding. The second circuit may be configured (i) to decode corrected video data into a video format in a first state, (ii) encode the corrected video data in a second state and (iii) share an external memory between the first circuit and the second circuit. The disc may be configured to store encoded video data in the second state.

20 Claims, 9 Drawing Sheets

UNIFIED MEMORY ARCHITECTURE FOR RECORDING APPLICATIONS

This is a divisional of U.S. Ser. No. 11/299,506, filed Dec. 12, 2005, now U.S. Pat. No. 7,624,330 which is hereby incorporated by reference in its entirety.

CROSS REFERENCE TO RELATED APPLICATIONS

The present application may relate to U.S. Pat. No. 7,600,177, filed Feb. 8, 2005, which is hereby incorporated by reference in its entirety.

FIELD OF THE INVENTION

The present invention relates to an optical recording generally and, more particularly, to a method and/or architecture for implementing a unified memory architecture for recording applications.

BACKGROUND OF THE INVENTION

Conventional read/write applications in DVD systems generally use multiple flash memories and synchronous dynamic random access memories (SDRAMs). A front end controller of a DVD system may need a dedicated flash memory and SDRAM to facilitate performing error correction on compressed video data.

Referring to FIG. 1, a diagram of a conventional Reed-Solomon Product Code (RSPC) block 50 used for error correction of digital video is shown. The RSPC block 50 uses rows and columns to encode an array of data bytes. In a DVD application, 172×192 bytes of data are encoded by adding sixteen bytes 52 (i.e., PO) in each column and ten bytes 54 (i.e., PI) in each row to form the final RSPC code 50 of 182×208 bytes. To better decode an RSPC block 50, iterative methods are conventionally used to decode by row and column and then by row and column again until either no more errors exist in the code or a best resulting code is established.

Each iteration is capable of changing up to all of the data bytes in the RSPC block 50 and update the decoding results in response to the changes. The ability to change the data commonly means that either the data block is saved locally or a lot of bandwidth is used moving the data back and forth from an external memory over a memory bus. Conventional decoding methods access each of the data bytes multiple times during processing. For example, after finishing decoding of a particular row, some of the data bytes in the particular row are often updated to correct errors found by the decoding. Therefore, when column decoding begins, column corrections are calculated based on partially corrected data. A next iteration of row decoding uses the partially corrected data from the previous column decoding, and so on.

As each decoding step processes a row or column, either the data bytes are saved locally until the iterations are complete or the data bytes are accessed across the memory bus in time for the associated row or column decode. Storing all of the data bytes locally results in a large local memory (i.e., 182 columns×208 rows×2 copies=75,712 bytes). Storing all of the data bytes in an external memory consumes a large amount of a memory bus bandwidth.

It would be desirable to reduce memory on a DVD system by implementing delta syndrome based iterative Reed-Solomon product decoder on a DVD system to produce a unified memory architecture for recording applications.

SUMMARY OF THE INVENTION

The present invention concerns an apparatus comprising a first circuit, a second circuit and a disc. The first circuit may be configured to (i) extract video data as data blocks from an input signal and (ii) perform error correction on the data blocks with a delta syndrome based iterative Reed-Solomon decoding. The second circuit may be configured (i) to decode corrected video data into a video format in a first state, (ii) encode the corrected video data in a second state and (iii) share an external memory between the first circuit and the second circuit. The disc may be configured to store encoded video data in the second state.

The objects, features and advantages of the present invention include providing a unified memory that may (i) be implemented in an optical recording system, (ii) reduce memory in a DVD system, (iii) combine memory resources between a front end controller and a back end controller and/or (v) decrease memory bandwidth for the DVD system.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
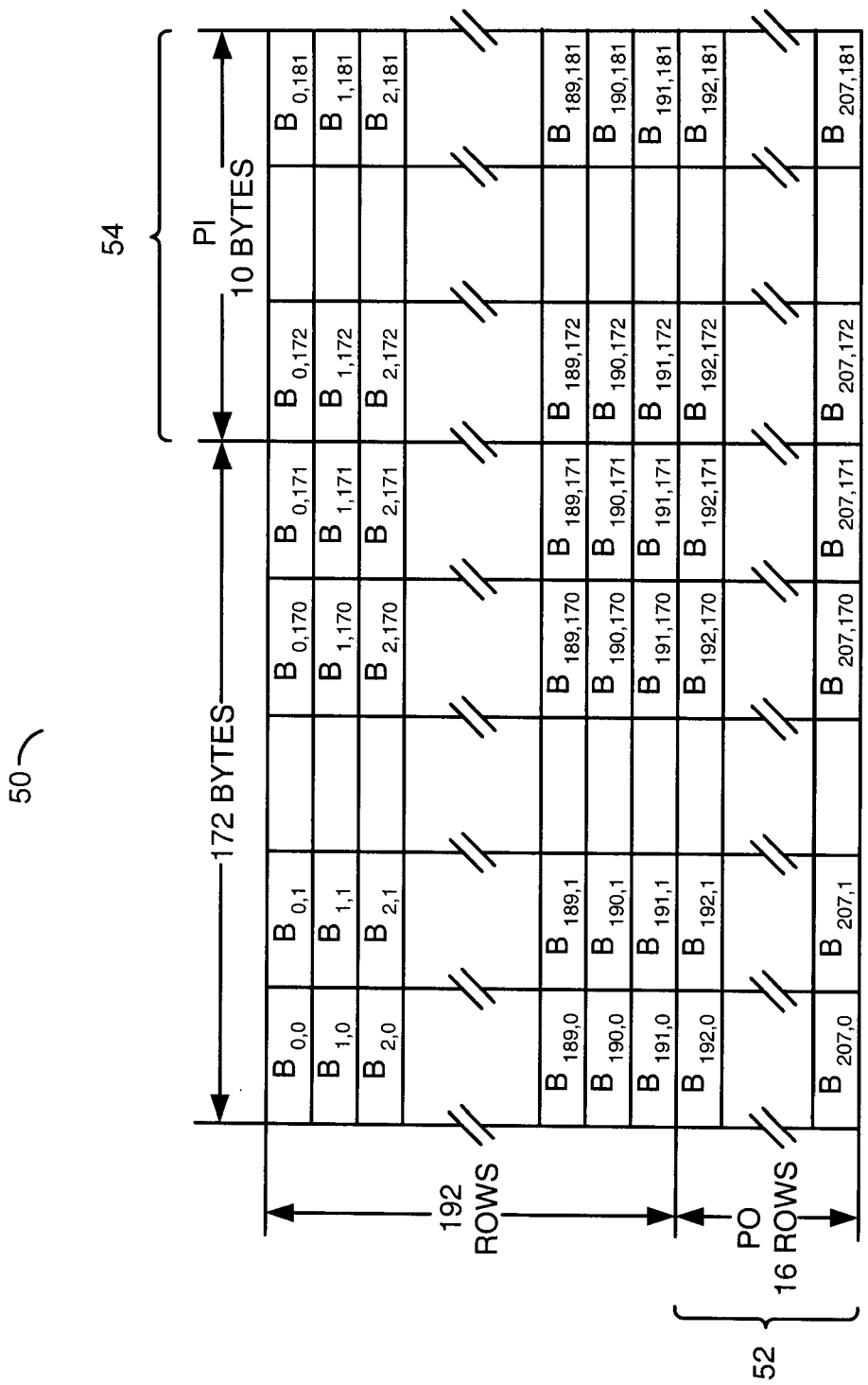
FIG. 1 is a block diagram of a conventional Reed-Solomon Product Code for error correction in digital video.
Figure 2:
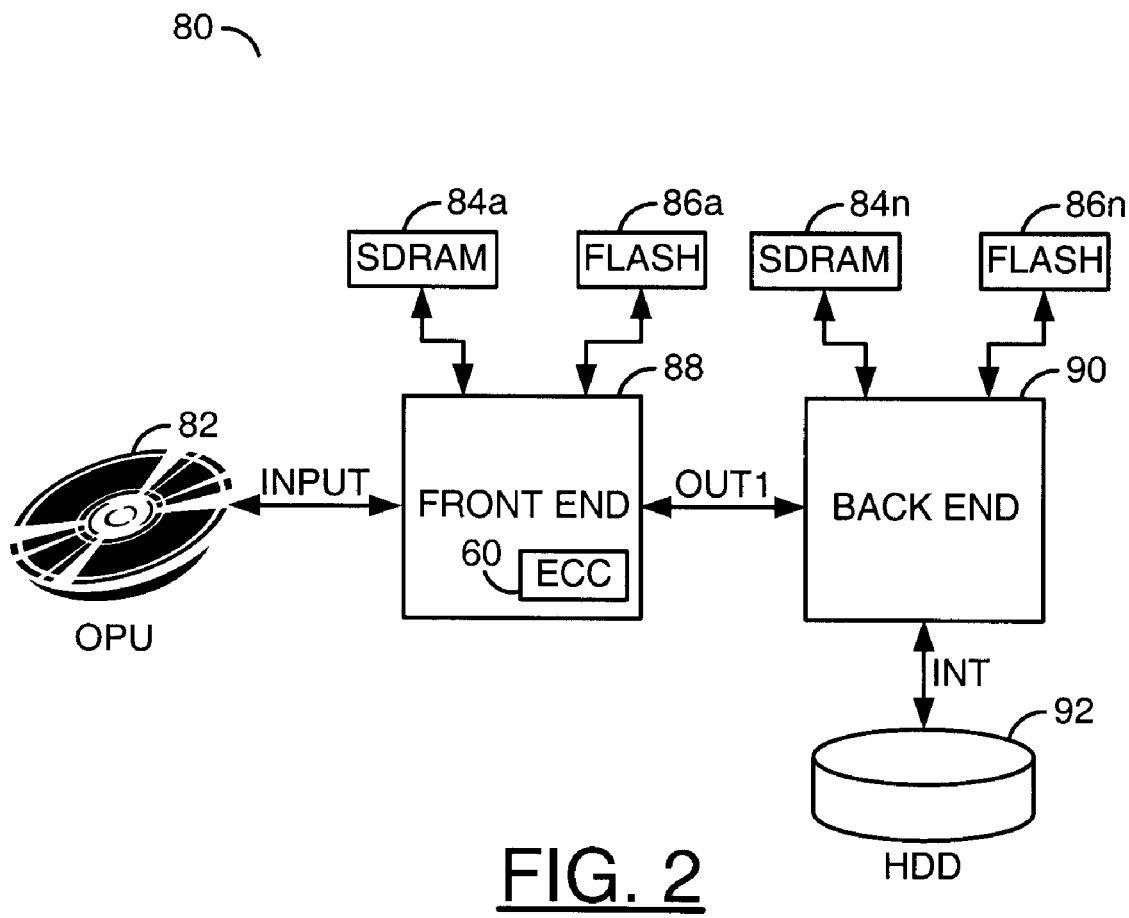
FIG. 2 is a block diagram of an example DVD read/write system.

Referring to FIG. 2, a block diagram of an example DVD read/write system 50 is shown. The system 80 comprises an optical disc 82, a number of SDRAMs 84-84n (or external memories), a number of flash memories 86a-86n, a front end controller 88, a back end controller (or encoder/decoder), and a high disc drive (HDD) 92. The optical disc 82 presents a signal INPUT to the front end controller 88. The front end controller 88 presents a signal OUT1 to the back end controller 90. The interface between the front end controller 88 and the back end controller 90 is implemented as an AT attachment packet interface (ATAPI). The back end controller 90 presents an intermediate signal (e.g., INT) to the hard disc drive 92. The front end controller 88 comprises an error correction code (ECC) module 60.

The front end controller 88 performs all of the functions necessary to extract video data (or extract compressed MPEG data stream) from the optical disc 82 over the signal INPUT. The front end controller 88 may perform analog processing, servo control, channel decoding and error correction. In a first state, the back end controller 90 may decode the corrected video data (or the MPEG data) to recreate the original video content. The back end controller 90 may present the original video content to a monitor (not shown). In a second state, the back end controller 90 (i) may encode the MPEG data and (ii) store the encoded MPEG data on the disc 92. The front end controller 88 and the back end controller 90 each need (i) dedicated memory (e.g., SDRAM 84a and 84n) and (ii) dedicated flash memory (e.g., 86a and 86n) to extract, decode and store original video content on the disc 92. The system 80 generally performs DVD read/write applications with multiple flash and SDRAM memories.

The ECC module 60 may perform error correction on the RSPC block 50 (or data block) using conventional iterative methods. Such conventional iterative methods store data bytes in the SDRAM 84a. Storing all of the data bytes in the SDRAM 84a generally consumes a large amount of memory bus bandwidth. Due to the large amount of memory bandwidth needed, straight forward RSPC decoding would be prohibitive for a shared memory architecture.

Figure 3:
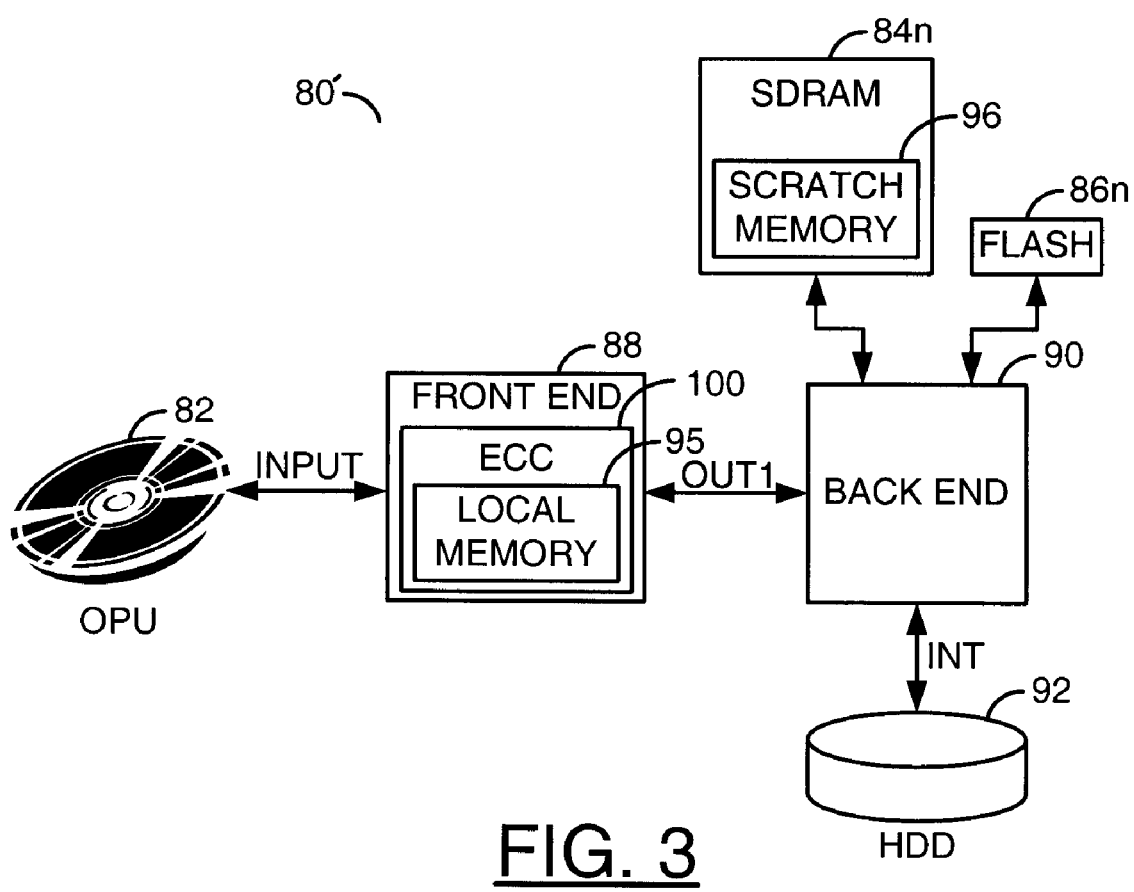
FIG. 3 is a block diagram of a system in accordance with a preferred embodiment of the present invention.

Referring to FIG. 3, a block diagram of a system 80' is shown in accordance with a preferred embodiment of the present invention. The system 80' may be implemented as a unified memory architecture (UMA). The front end controller 88 generally comprises an ECC module 100 that may perform iterative decoding on the RSPC block 50. The system 80' generally provides a mechanism to combine the memory (e.g., the SDRAM) of the front end controller 88 with the memory (e.g., SDRAM 84n) of the back end controller 90 (or encoder/decoder). The SDRAM 84n generally comprises a scratch memory 96. The ECC module 100 generally comprises a local memory 95. The interface used to allow the front end controller 88 to communicate with the back end controller 90 and the ECC module 100 is a stream data interface connection (or SDI interface). The back end controller 90 may communicate with the hard disc drive 92 via the ATAPI interface.

For the unified memory access (UMA) architecture on the system 80' to be feasible, the ECC module 100 may need an innovative RS decoding mechanism. The ECC module 100 may be implemented as a delta syndrome based RS product decoding. The ECC module 100 may reduce the amount of memory (e.g., SDRAM and/or flash) needed to perform read/write applications in the DVD system. The ECC module 100 generally reduces the overall bandwidth on the system 80'.

The system 80' may use a two pass design. In a first pass, the front end controller 88 may send data through the back end controller 90 and store the data in the scratch memory 96 of the SDRAM 84n. In a second pass, the front end controller 88 may (i) retrieve the data back from the scratch memory 96, (ii) combine the data with correction values generated from the ECC module 100 and (iii) send the corrected data to a final location in the SDRAM 84n. The flash memory 86n may be used to store firmware for the front end controller 88 and the back end controller 90. Generally, data may be read or written to or from the disc 92.

Figure 4:
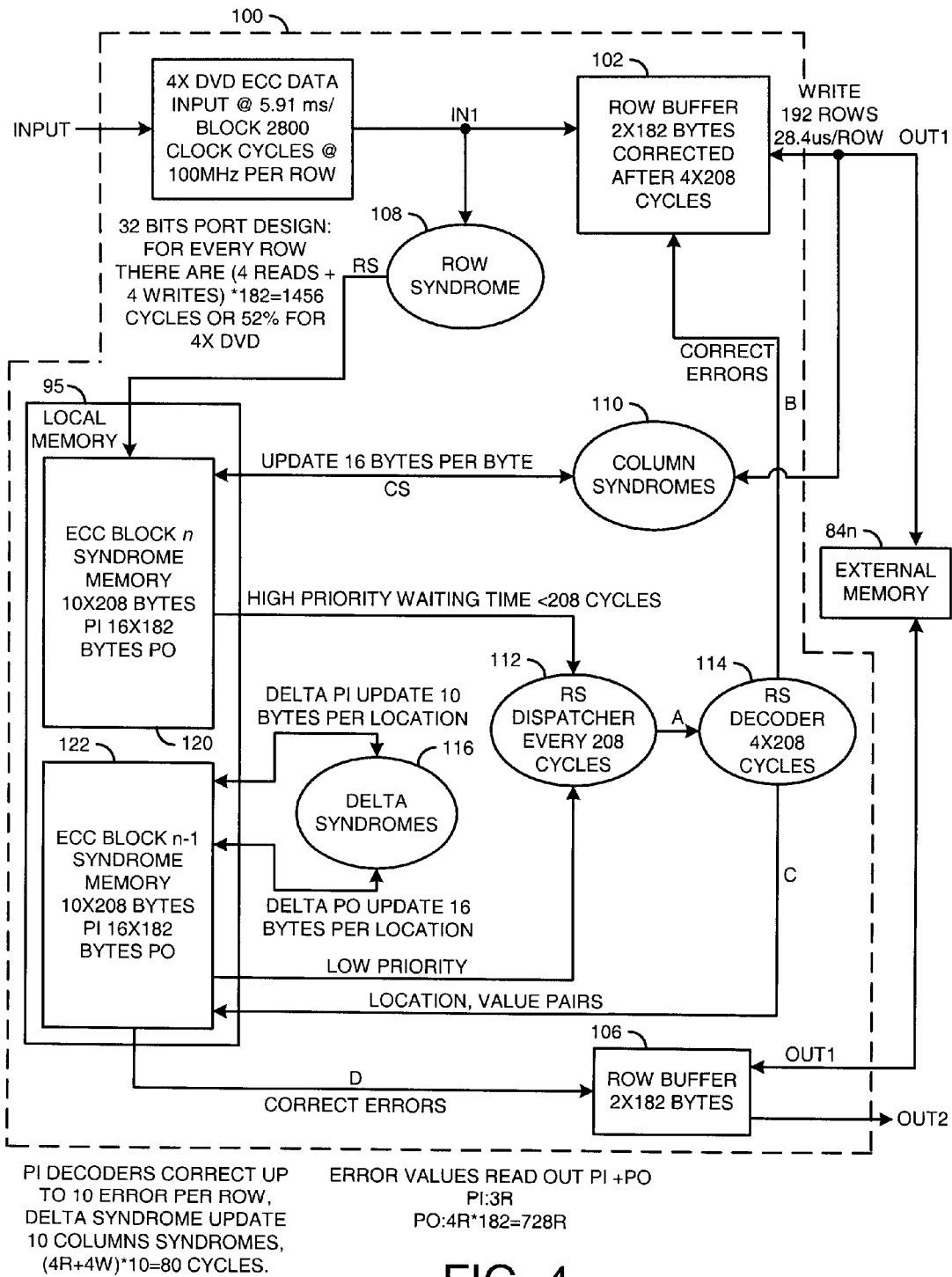
FIG. 4 is a detailed block diagram of an error correction code module in accordance with the present invention.

Referring to FIG. 4, a block diagram of the ECC module 100 is shown. The ECC module 100 generally comprises a circuit (or module) 102, an optional circuit (or module) 106, a circuit (or module) 108, a circuit (or module) 110, a circuit (or module) 112, a circuit (or module) 114 and a circuit (or module) 116. The circuit 100 may receive the signal INPUT at the circuit 102 and the circuit 108. The circuit 106 may receive the signal OUT1. The ECC module 100 may include the SDP interface (not shown). The circuit 106 may be implemented in the ECC module 100. The ECC block 100 may present data blocks to the scratch memory 96 in the external memory 84n or to a final location directly in the external memory 84n. An output signal (e.g., OUT2) may be generated by the circuit 106.

The signal IN1 may be arranged as a sequence of DVD RSPC blocks. The blocks may have a transfer rate of 5.91 milliseconds per block at a 4× speed. Processing of each row within the signal IN1 may be achieved in one implementation within 2800 clock cycles of a 100-megahertz clock. Each byte of data in the signal IN1 may be received by the row buffer circuit 102 and the row syndrome module 108 as a 9-bit unit every 15.4 clock cycles.

The ECC module 100 may be operational to perform a delta syndrome based iterative Reed-Solomon decoding method. The ECC module 100 generally saves only syndromes for rows and columns of a Reed-Solomon Product Code (RSPC) Error Correction Code (ECC) block (e.g., 50) in the local memory circuit 95. An iterative (alternating) decoding may be applied to delta syndrome changes by the delta syndrome module 116. After the iterative decoding completes, error correction results may be available in the local memory circuit 95 to correct the data received in the RSPC. As such, (i) the local memory size may be reduced to a fraction of a size for a conventional decoder and (ii) a memory access bandwidth utilization may be reduced to a minimum. The minimum memory access bandwidth generally allows the implementation of a unified memory access structure interface to the circuit 80'.

The ECC module 100 generally does not update the data received in the RSPC block 50 during the iterative decoding. Instead, results of the iterative decoding may be compressed and saved in the local memory circuit 95 and then applied to the data afterwards. For example, the results of the iterative decoding may be stored in the local memory circuit 95 in place of syndrome information.

The delta syndrome module 116 may be operational to update the column syndromes directly. A resulting effect on the column syndromes may be similar to conventionally updating the data and then recalculating the column syndromes. The RS decoder module 114 may be operational to row/column decode the row/column syndromes stored in the local memory circuit 95. The delta syndrome module 116 may be further operational to update the column/row syndromes based on the results of the row/column decoding conveyed in a signal (e.g., C).

When the circuit 100 receives a block of data in the signal IN1, the row syndrome module 102 may calculate the row syndromes. The row syndromes may be transferred in a signal (e.g., RS) to the local memory circuit 95 and saved.

The RS dispatcher module 112 may be operational to select each row syndrome shortly after being saved in the local memory circuit 95 and provide the selected row syndrome to the RS decoder module 114. In one embodiment, each newly generated row syndrome may be read from the local memory circuit 95 by the RS dispatcher module 112 in less that 208 clock cycles.

The RS decoder module 114 may be operational to generate row error correction data by decoding the row syndromes. The row error correction data may be transferred in a signal (e.g., B) to the row buffer circuit 102. The RS decoder module 114 may be arranged as a pipeline structure having a depth of 208 clock cycles. The pipeline may have 3 stages of 208 cycles each.

Dynamic control of the RS decoder module 114 may be independent of the first pass (e.g., pass 1) and the second pass (iterative decoding) (e.g., pass 2) of the decoding. A 10-bit identification (e.g., rs_id) may be used in the pipeline generally comprising (i) "00+row" for pass 1, (ii) "01+column" for pass 2 PO decoding, (iii) "10+row" for pass 2 PI decoding and (iv) "11+0xff" for an idle slot. The identification "00" generally has a highest priority and may be used for pass 1 work.

Identification "00" jobs may wait less than 208 cycles before being processed by the RS decoder module 114. A pass 2 job may be cancelled if a "00" job takes the slot. Identifications "01" and "10" have a second priority. A "01" job or a "10" job may be cancelled by a "00" job. Checks may be performed to see if "01" jobs or "10" jobs go completely through the pipeline. If a job is cancelled, the RS decoder module 114 may read the cancelled job again from the local memory circuit 104. Reading syndromes from the local memory circuit 104 generally has the lowest priority among memory accesses. An identification of "11" may be considered an idle slot indicating that no pass 1 or pass 2 jobs may be ready for decoding.

The RS decoder module 114 may process a received job within 208 cycles. The result of the processing may be sent to different process logic based on the "mode" and the identifications "00", "01", "10" and "11". The row buffer circuit 102 may record all the information from the results generated by the RS decoder module 114. The row buffer circuit 102 may use the recorded information to correct errors in the data block rows during the first pass. The RS decoder module 114 may also be operational to organize the error values generated by the decoding and save the error values in the local memory circuit 95. Updating one or more Bit Error Rate (BER) counters may be performed by the RS decoder module 114. Furthermore, the RS decoder module 114 may record uncorrectable rows by a row identification number and uncorrectable columns by a column identification number.

The row buffer circuit 102 may be operational to buffer up to two full rows of the RSPC block 50 at any given time. The row buffer circuit 102 may be further operational to apply the row error correction information received in the signal B to the data as buffered. The corrected data may be presented to the final location in the external memory 84n (or SDRAM). In one embodiment, the correction of the buffered data may be performed after 4×208 clock cycles. The data transfers to the external memory 84n may be performed as 192 row writes at 28.4 microseconds per row. The data may also be transferred to the column syndrome module 110 as a 182-byte set.

The column syndrome module 110 may be operational to calculate the column syndromes substantially simultaneously with the syndrome module 108 calculating the row syndromes. The column syndromes may be transferred in a signal (e.g., CS) to the local memory circuit 95 and saved. The local memory circuit 95 may only save the row syndromes and the column syndromes of the RSPC block 50, but not the data from the signal IN1. The data block in the signal IN1 may be transferred by the row buffer circuit 102 to the external memory 84n. The external memory 84n may store the data block outside the ECC module 100 until the ECC module 100 is ready for further processing.

The column syndrome calculation may be completed after the entire RSPC block 50 has been received by the row buffer circuit 102. The RS dispatcher module 112 may dispatch row syndromes or column syndromes periodically (e.g., every 208 clock cycles) to the RS decoder module 114. The RS decoder module 114 may generate location and error value pairs based on the syndrome being decoded. The location and error value pairs may be transferred by a signal (e.g., C) to the local memory circuit 95 and saved.

The delta syndrome module 116 may be operational to perform the RSPC iterative decoding from row to column and column to row. During row-to-column and column-to-row switches, the delta syndrome module 116 may be used to update the appropriate syndromes. After the iterations reach a predefined limit or there are no more errors detected in the code, the iterating may be stopped. After the iterating is stopped, the decoding results may be save locally in place of syndrome. The decoding results may be available in the signal D for correcting the data block stored in the external memory circuit 84n.

The iterative decoding is generally based only on delta syndromes. The decoding results may not be presented until the iterating has finished. Therefore, the correction of the data block may be delayed until all of the decoding has been completed and the error location and error value information have been saved in place of the syndromes. As such, usage of the local memory circuit 95 may be small. In one embodiment, the PI decoding may allow for the correction of up to 10 errors per row. A delta syndrome update to the 10 column syndromes may involve 4 reads and 4 writes for each of the 10 columns using 80 cycles.

The local memory circuit 95 generally comprises a first block (or module) 120 and a second block (or module) 122. Each of the blocks 120 and 122 may be used in decoding one RSPC block 60 at a time. Utilizing two memory blocks 120 and 122 generally permits the circuit 100 to start working on a subsequent RSPC block (e.g., a block n, at a time t) while calculations for a prior RSPC block (e.g., a block (n-1), at a time (t-1)) may be in progress.

The memory blocks 120 and 122 may be configured to store 9 bits per byte of information, save syndromes and save error location pairs. The syndrome data and the error location pairs may be distinguished by a most significant bit (MSB). Where MSB=0, the information may represent a syndrome. Where MSB=1, the information may be an error location pair.

The memory blocks 120 and 122 may provide separate (i) erasure based results and (ii) none-erasure based results. The erasure based results may be saved in a low address range without location. Locations may be common for all the rows or columns saved in a table. The error location pairs may be saved in a top address range with location bytes MSB=1. The memory blocks 120 and 122 may also record erasure degrees used in the RS decoder module 114.

For a DVD application, conventional methods utilize 80 kilobytes (Kbytes) of local memory whereas the circuit 100 may utilize a total of about 10 Kbytes. Furthermore, since the data block is only written once and read once from a final location in the external memory 84n, a memory bandwidth supported by a bus carrying the signal OUT1 from the row buffer circuit 102 to the external memory circuit 84n may operate at only twice a data rate of the RSPC block 50. The memory bandwidth may operate at twice the data rate if the final error correction is performed at the back end controller 90. The memory bandwidth may operate at three times the data rate of the RSPC block 50 if the final error correction is performed in the front end controller 88. For example, the data block may be (i) written in the scratch memory 96 (from the front end controller 88), (ii) read from the scratch memory 96 (data block sent back to the front end controller 88), and (iii) written to a final location in the external memory 84n (from the front end controller 88). In addition, the circuit 100 may provide fast decoding compared to conventional methods, because each RS code is started from 10 or 16 bytes of syndrome instead of 182 or 208 bytes of data. Finally, implementation of the unified memory access structure generally reduces total system cost.

The ECC module 100 may implement a two-pass method, as mentioned above. In the first pass (e.g., pass 1), initial row syndromes and initial column syndromes may be generated and stored in the local memory circuit 95. In the second pass (e.g., pass 2), the iterative decoding of the syndromes may be used to update the stored syndromes.

Figure 5:
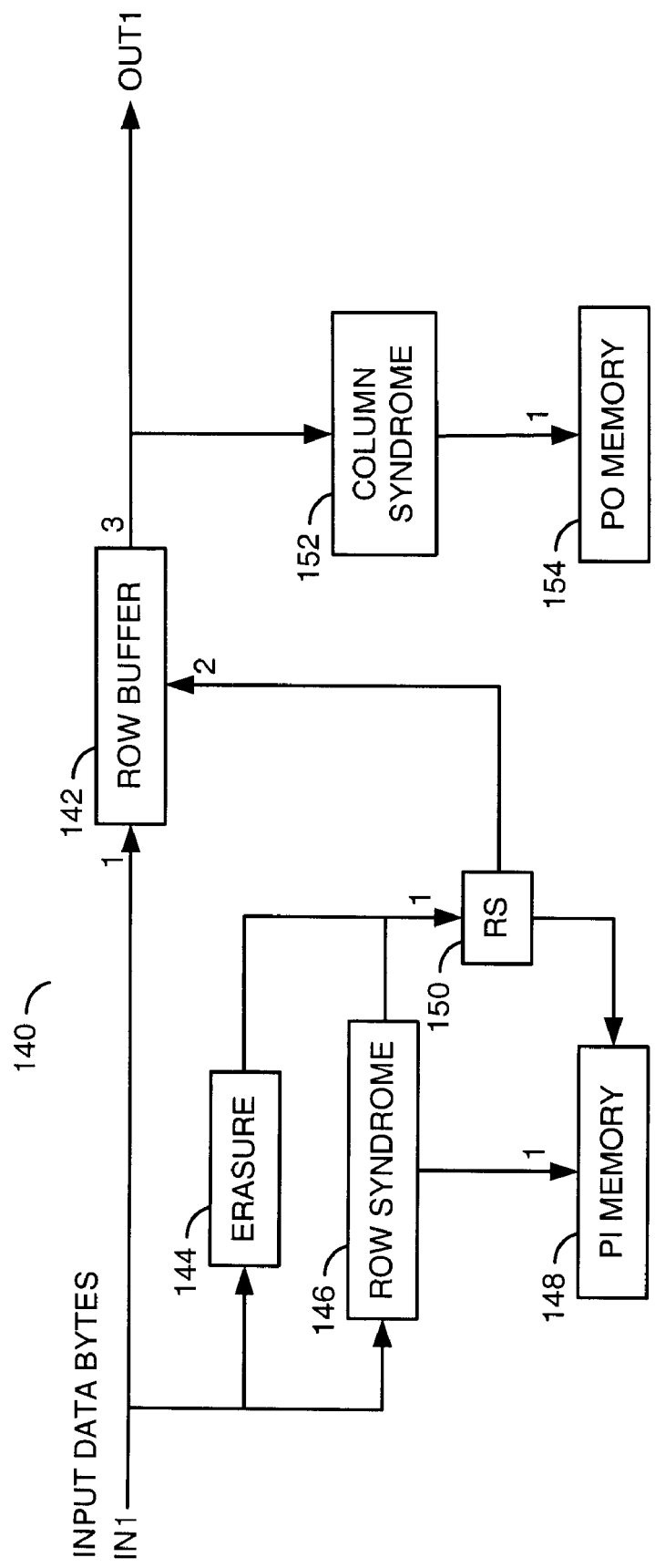
FIG. 5 is a block diagram of functional flow of a first pass.

Referring to FIG. 5, a block diagram of an example functional flow 140 of a first pass is shown. The function flow 140 generally comprises a step (or module) 142, a step (or module) 144, a step (or module) 146, a PI memory block (or module) 148, a step (or module) 150, a step (or module) 152 and a PO memory block (or module) 154. The signal IN1 may provide input data to the flow 140. The signal OUT1 may be presented as an output to the external memory 84n. The PI memory block 148 and the PO memory block 154 may reside in the local memory 95.

The first pass generally starts with a reception of the data block in the signal IN1 from an eight-to-fourteen demodulation (not shown). The data may be received as a byte of information within a 9-bit package, with the most significant bit acting as an erasure flag. In one embodiment, a minimum time between bytes may be 12 clock cycles.

The first pass may include calculating the row syndromes from the data block in the step 146 and calculating erasure locator polynomials from the data block in the step 144. The row syndromes may be stored in the PI memory block 148. The data block may be subject to a row buffering 142 (e.g., row buffer 102).

The row syndromes and the erasure locator polynomials may be provided to a decoding 150. The decoding 150 (e.g., RS decoder 114) may operate on the received row syndrome to generate a result. The result may include row correct error information. The row buffer 142 may use the row error corrections to update the data block prior to presenting the data block in the signal OUT1. Since the detected errors may have been corrected, an appropriate row in the PI memory block 148 may be reset to zero as an indication that no errors were detected and/or errors have been corrected. Otherwise, the row may be marked as uncorrectable. As the data block is presented (e.g., at 1 byte per 8 clock cycles) to the final location in the external memory 84n, the column syndromes may be calculated in step 152 and saved in the PO memory block 154.

Figure 6:
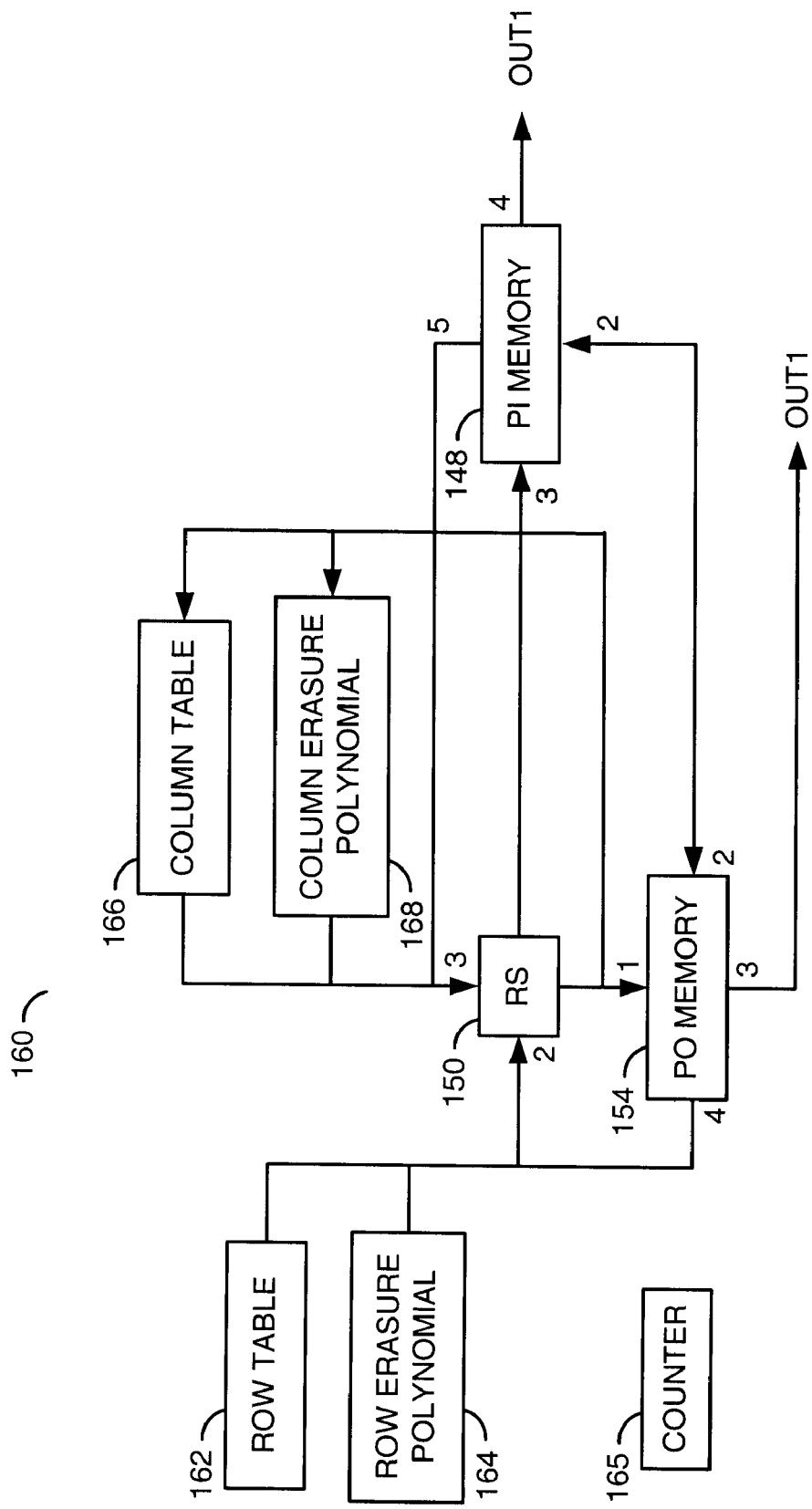
FIG. 6 is a block diagram of function flow of a second pass.

Referring to FIG. 6, a block diagram of an example functional flow 160 of a second pass is shown. The second pass generally comprises the PI memory block 148, the decoding block 150, the PO memory block 154, a row table block (or module) 162, a step (or module) 164, a step (or module) 165, a step (or module) 166 and a column table step (or module) 168.

The second pass may start after receiving all of the data block and one extra row time to process the last row. Iteration counters may then be reset and row erasure locator polynomial may be calculated by the step 164. A column syndrome may then be read from the PO memory block 154. If the column syndrome is zero, a next column may be considered. Once a non-zero column syndrome is found, the non-zero column syndrome may be provided to the decoding step 150 (e.g., RS decoder 114). The decoding generally provides results back to the PO memory block 154 and the PI memory block 148. The delta syndromes may be calculated for the respective rows and the row syndromes may be updated accordingly. The updated syndromes may be saved back into to PI memory block 148.

The row syndrome may be read from PI memory block 148. If a particular row syndrome is zero, a next row syndrome may be checked. If not, a decoding job for the particular row syndrome may be set to the decoding step 150. The decoding step 150 generally returns results. The results may be used to calculate the column delta syndromes. Afterwards, the updated column syndromes may be saved in the PO memory block 154 and the row marked as decoded.

Iterations may continue with the columns again until an iteration counter 165 is met or erasure decoding is used once. After the iterations have completed, a done signal may be presented and a check of a ready signal may be performed. The second pass may continue with organizing data from the PI/PO memories 148/154 in row order which may then be sent via the SDP interface to reside in the final location of the external memory 84n. After all of the error correction data is sent out, (i) an end signal may be generated, (ii) the error counter registers may be updated and (iii) the process waits for a next RSPC block 50.

Calculate Erasure Polynomial: If an erasure is flagged at location j within the code word, then $a^{-j}$ may be a root of an erasure locator polynomial (e.g., PER). The erasure locator polynomial PER may be expressed as follows:

$$PER=(x+a^{-j1})(x+a^{-j1})\ldots(x+a^{-je}) \quad \text{Eq. (1)}$$

Note that the location j is generally labeled different in DVD specifications and papers as compared to Reed-Solomon papers. In the DVD documentation, a first byte is commonly labeled as "0" and a last byte as "N−1". In Reed-Solomon coding papers, a GF(256) code may be N=255 bytes length, thus a first byte is commonly labeled "254" and a last byte is labeled "0". Any N less than 255 may be called a shortened code. The parity R bytes are generally the last R bytes of the code. For a case of DVD PO code of N=208, a location of the first byte may be 207. If there is an error at the first byte, the location may be referred to as $a^{-207}$.

Reading the DVD data in the first pass may include generating an erasure locator polynomial. Let "d" be a degree of the erasure locator polynomial PER, where d<=10. At most d=10 so the polynomial may have 11 items as follows:

$$PER=er_0x^{10}+er_1x^9+er_2x^8+\ldots+er_{10}x^0 \quad \text{Eq. (2)}$$

For any degree d, the erasure locator polynomial may be expressed as follows:

$$PER=er_0x^d+er_1x^{d-1}+er_2x^{d-2}+\ldots+er_dx^0 \quad \text{Eq. (3)}$$

Starting from d=0:

$$PER=er_0x^0, \text{ where } er_0=1 \quad \text{Eq. (4)}$$

Calculate new erasure polynomial (e.g., $PER_{new}$):

$$PER_{new}=PER*(x+a^{-j}), \text{ where j is a byte locator} \quad \text{Eq. (5)}$$

For byte 0 in the data stream, a value of j may equal 181. Thereafter, $a^{-j}$ may be updated for every byte received as follows:

$$a^{-(j+1)}=a^{-j}*a^{-1} \quad \text{Eq. (6)}$$

If MSB=0, no erasure may be performed for the byte. If MSB=1, PER may be updated as follows:

$$\begin{aligned}PER_{new} &= PER*(x+a^{-j}) \quad \text{Eq. (7)}\\ &= (er_0x^d+er_1x^{d-1}+er_2x^{d-2}+\ldots+er_dx^0)*(x+a^{-j})\\ &= er_0x^{d+1}+(er_0*a^{-j}+er_1)x^d+(er_1*a^{-j}+er_2)x^{d-1}+\\ &\quad \ldots+(er_{d-1}*a^{-j}+er_d)x^1+er_d*a^{-j}x^0\end{aligned}$$

Figure 7:
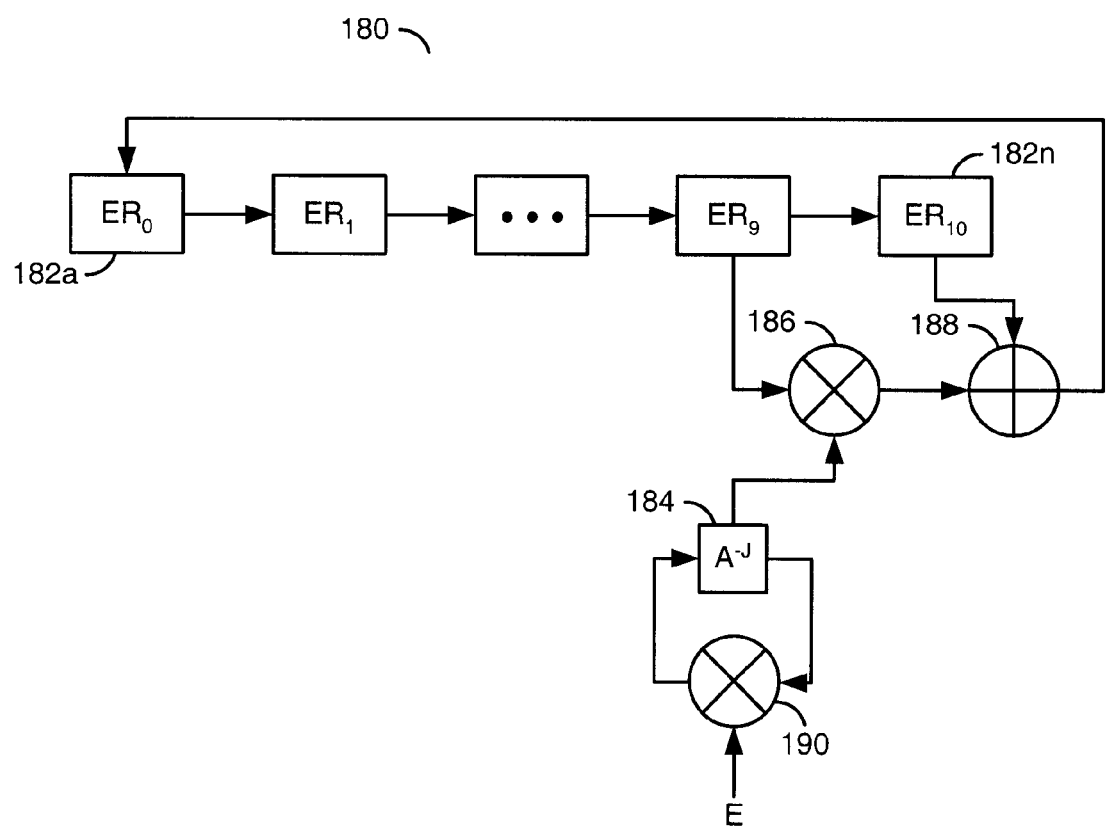
FIG. 7 is a block diagram of a circuit for generating an error locator polynomial.

Referring to FIG. 7, a block diagram of an example implementation of a circuit 180 for generating the error locator polynomial PER is shown. The circuit (or module) 180 generally comprises multiple registers 182a-182n, a register 184, a multiplier 186, and adder 188 and a multiplier 190. The registers 182a-182n may be connected in series with the last two registers 182(n-1) and 182n having outputs connected to inputs of the multiplier 186 and the adder 188, respectively. An output of the multiplier 186 may be connected to a second input of the adder 188. An output of the adder 188 may be connected to an input of the first register 182a. An output of the register 184 may be connected to a second input of the multiplier 186 and an input of the multiplier 190. A second input of the multiplier 190 may receive a signal (e.g., E). An output of the multiplier 190 may be connected to an input of the register 184. Other designs of the circuit 180 may be implemented to meet the criteria of a particular application.

Calculate Syndromes: For a Reed-Solomon (RS) code word of (N, K), where N is a code word length in bytes and K is a number of information bytes, an R number of syndromes may be calculated by evaluating R number of roots of the polynomial g(x). Assume the received code word is shown in equation 3 above, then:

$$s_0=C(a^0), s_1=C(a^1), \ldots, s_{R-1}=C(a^{R-1})$$

The syndrome polynomial is generally expressed as follows:

$$s(x)=s_{R-1}x^{R-1}+s_{R-2}x^{R-2}+\ldots+s_1x+s_0 \quad \text{Eq. (8)}$$

Figure 8:
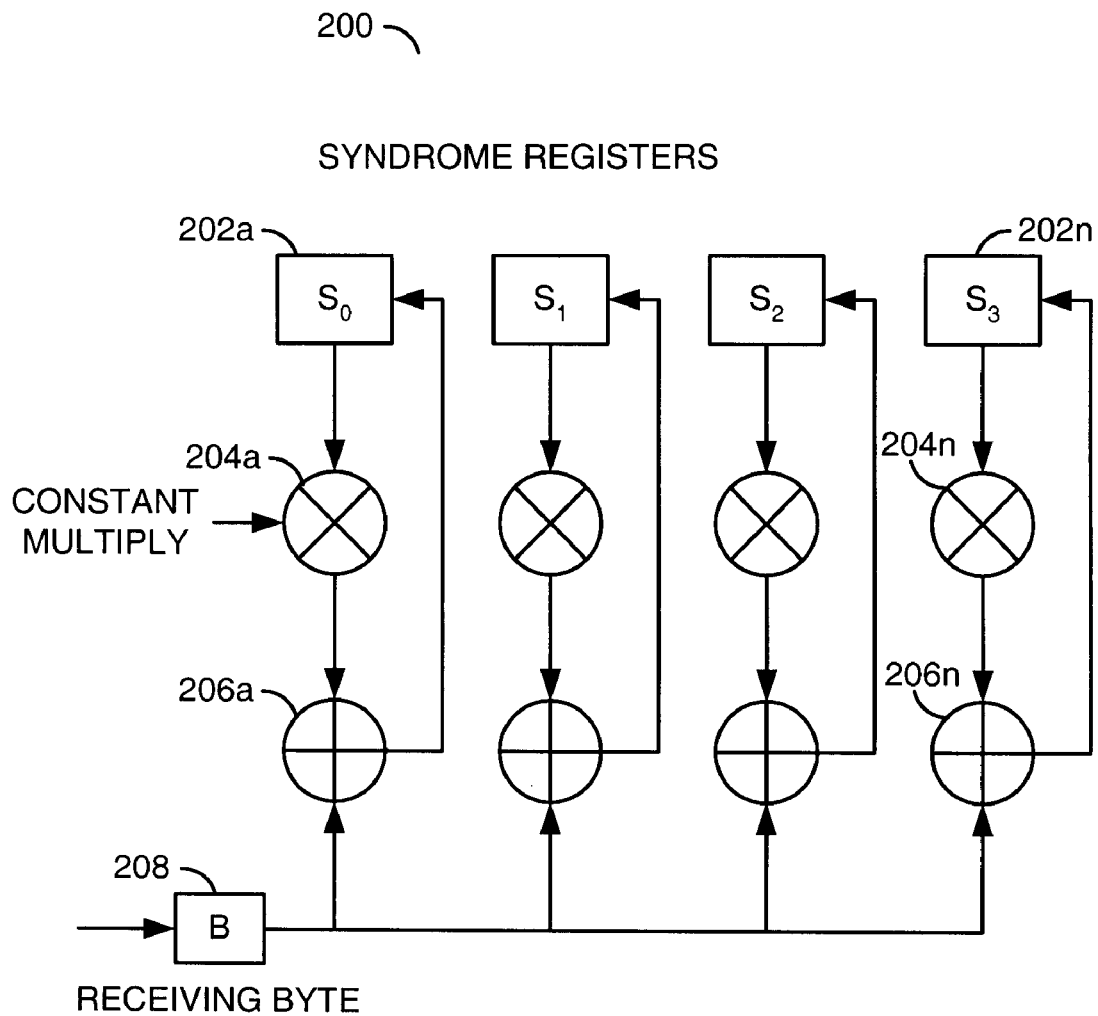
FIG. 8 is a block diagram of a circuit for generating syndromers.

Referring to FIG. 8, a block diagram of an example implementation of a circuit 200 for generating the syndromes is shown. The circuit 200 generally comprises multiple register 202a-202n, several multipliers 204a-204n, several adders 206a-106n and a register 208. An output of the register 208 may be connected to one input of each of the adders 206a-206n. A second input to each adder 206a-206n may be connected to an output of a respective multiplier 204a-204n. An output of each adder 206a-206n may be connected to an input of a respective register 202a-202n. An input to each of the multipliers 204a-204n may receive a multiplication constant. A second input of each multiplier 204a-204n may be connected to an output of a respective register 202a-202n.

Figure 9:
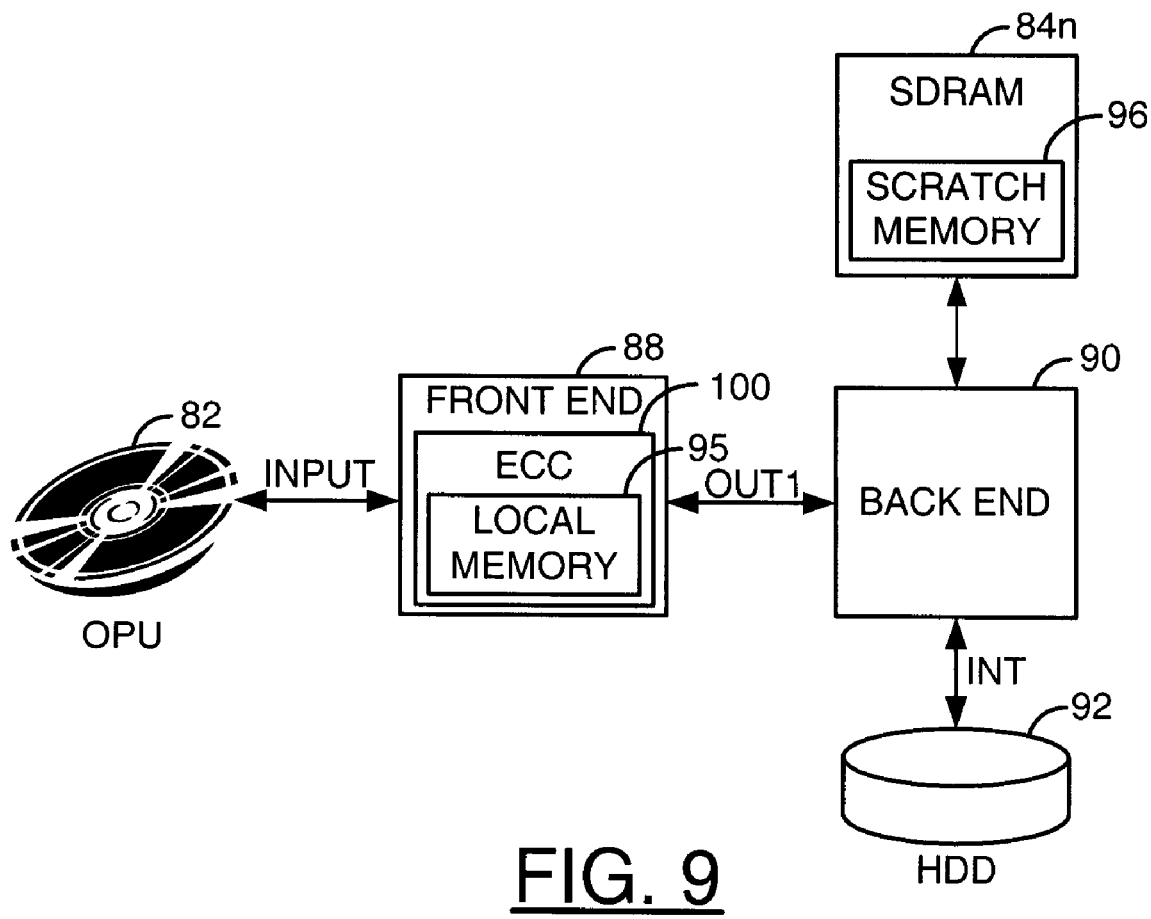
FIG. 9 is a block diagram of a system in accordance with an alternative embodiment of the present invention.

Referring to FIG. 9, a block diagram of a system 80" of an alternative embodiment of the present invention is shown. The SDRAM 84n may be shared with the front end controller 88 and the back end controller 90. The flash memory that is normally coupled to the back end controller 90 may be moved into the "boot region" of the HDD 92. In general, present standalone HDD drives have a respective program stored in the boot region of the HDD 92. The system 80" may need a new interface definition between the back end controller 90 and the hard disc drive 92. The new interface definition may be needed when the HDD 92 boots up first after power up transfers program code to the back end controller 90.

As used herein, the term "simultaneously" is meant to describe events that share some common time period but the term is not meant to be limited to events that begin at the same point in time, end at the same point in time, or have the same duration.

The function performed by the flow diagram of FIGS. 5-6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICS, FPGAS, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
a first circuit that (i) generates an input signal by reading compressed-and-encoded video from a source, (ii) extracts video data as a first block arranged as a Reed-Solomon product code from said input signal, (iii) transfers said first block onto a first bus, (iv) calculates a plurality of correction values in final form corresponding to said first block while said first block remains unaltered as initially written in an external memory, (v) retrieves said first block from said first bus and (vi) corrects said first block as received via said first bus with said correction values to generate corrected video data; and
a second circuit that (i) decodes said corrected video data to generate decoded video data while in a first state, (ii) encodes said decoded video data to generated encoded video data in a second internal signal while in a second state, (iii) receives said first block from said first circuit via said first bus, (iv) transfers said first block to said external memory via a second bus, (v) receives said first block from said external memory via said second bus and (vi) transfers said first block to said first circuit via said first bus.

2. The apparatus according to claim 1, wherein said first circuit comprises an error correction code module that generates (i) a plurality of syndromes from said first block and (ii) said correction values from said syndromes.

3. The apparatus according to claim 2, wherein said error correction code module comprises a row syndrome module that calculates a plurality of first row syndromes of said syndromes from said first block.

4. The apparatus according to claim 3, wherein said error correction code module further comprises a column syndrome module that calculates a plurality of first column syndromes of said syndromes from said first block.

5. The apparatus according to claim 4, wherein said error correction code module further comprises a decoder module that decodes in a sequence alternating between a first pass and a second pass, wherein (i) said first pass comprises decoding said first column syndromes to generate column correction results and (ii) said second pass comprises decoding said first row syndromes to generate row correction results.

6. The apparatus according to claim 5, wherein said error correction code module further comprises a delta syndrome module that (i) updates said first row syndromes in response to said column correction results and (ii) updates said first column syndromes in response to said row correction results.

7. The apparatus according to claim 6, further comprising a local memory coupled to said row syndrome module, said column syndrome module, said delta syndrome module and said decoder module, wherein said local memory (i) stores both said first row syndromes and said first column syndromes from said first block while said syndromes are being updated, (ii) stores said correction values in place of said syndromes once updating is complete and (iii) excludes said first block.

8. The apparatus according to claim 7, wherein said first circuit further comprising a buffer connected to said first bus, wherein said buffer (i) stores at least two rows of said first block and (ii) presents said first block one row at a time to both said first bus and said column syndrome module.

9. The apparatus according to claim 8, wherein said external memory stores said first block as presented from said buffer.

10. The apparatus according to claim 7, wherein said local memory stores both a plurality of second row syndromes and a plurality of second column syndromes from a second block of said input signal substantially simultaneously with storing said first row syndromes and said first column syndromes of said first block.

11. The apparatus according to claim 10, wherein said row syndrome module writes said second row syndromes of said second block substantially simultaneously with said delta syndrome module updating said first row syndromes and said first column syndromes of said first block.

12. The apparatus according to claim 7, further comprising a dispatcher module connected between said local memory and said decoder module, wherein said dispatcher module presents a plurality of decode jobs from said local memory to said decode module based on a corresponding priority of said decode jobs.

13. The apparatus according to claim 12, wherein each of said decode jobs comprises one of (i) decoding said first row syndromes and (ii) decoding said first column syndromes.

14. The apparatus according to claim 6, wherein said decoder module further generates said correction values based on said syndromes.

15. The apparatus according to claim 1, wherein said first bus implements a stream data interface.

16. The apparatus according to claim 1, wherein said second bus implements an AT attachment packet interface that is controlled by said second circuit.

17. The apparatus according to claim 1, wherein a bandwidth of said first bus is at least three times a data rate of said first block.

18. The apparatus according to claim 1, wherein said transfer of said first block from said second circuit to said first circuit is performed only after all calculations of said correction values have completed.

19. The apparatus according to claim 1, wherein said second circuit uses said external memory while in said first state and said second state.

20. An apparatus comprising:
means for (i) generating an input signal by reading compressed-and-encoded video from a source, (ii) extracting video data as a first block arranged as a Reed-Solomon product code from said input signal, (iii) transferring said first block to onto a first bus, (iv) calculating a plurality of correction values in final form corresponding to said first block while said first block remains unaltered as initially written in an external memory, (v) retrieving said first block from said first bus and (vi) correcting said first block as received via said first bus with said correction values to generate corrected video data; and
means for (i) decoding said corrected video data to generated decoded video data while in a first state, (ii) encoding said decoded video data to generated encoded video data in a second internal signal while in a second state, (iii) receiving said first block from said first bus, (iv) transferring said first block to said external memory via a second bus, (v) receiving said first block from said external memory via said second bus and (vi) transferring said first block to said means for retrieving via said first bus.

* * * * *